(12) United States Patent
Irsigler et al.

(10) Patent No.: US 9,269,713 B2
(45) Date of Patent: Feb. 23, 2016

(54) SEMICONDUCTOR DEVICE AND METHOD FOR PRODUCING THE SAME

(71) Applicant: Infineon Technologies Austria AG, Villach (AT)

(72) Inventors: Peter Irsigler, Obernberg/Inn (AT); Franz Hirler, Isen (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 74 days.

(21) Appl. No.: 13/909,726

(22) Filed: Jun. 4, 2013

(65) Prior Publication Data
US 2014/0353742 A1  Dec. 4, 2014

(51) Int. Cl.
*H01L 27/092* (2006.01)
*H01L 21/8238* (2006.01)

(52) U.S. Cl.
CPC ...... *H01L 27/092* (2013.01); *H01L 21/823885* (2013.01)

(58) Field of Classification Search
CPC .............. H01L 27/092; H01L 2924/01023
USPC .......................................... 257/329
See application file for complete search history.

(56) References Cited

U.S. PATENT DOCUMENTS

| | | | |
|---|---|---|---|
| 7,943,955 B2 | 5/2011 | Haeberlen et al. | |
| 2007/0272953 A1* | 11/2007 | Hirler | 257/285 |
| 2008/0035987 A1* | 2/2008 | Hebert | 257/330 |
| 2009/0114971 A1* | 5/2009 | Cai et al. | 257/315 |
| 2013/0264653 A1* | 10/2013 | Cai et al. | 257/369 |

* cited by examiner

Primary Examiner — Jerome Jackson, Jr.
Assistant Examiner — Damian A Hillman
(74) Attorney, Agent, or Firm — Murphy, Bilak & Homiller, PLLC

(57) ABSTRACT

A power semiconductor device comprises a first substrate that is highly doped with a first dopant type, the first substrate having a front face and a back face, the back face forming a backside of the device, a vertical p-type FET and a vertical n-type FET provided laterally adjacent to each other on the front face of the first substrate, wherein one of the FETs has a first drift zone with a complementary doping to the first dopant of the first substrate, and wherein the p-type FET and the n-type FET share the first substrate as a common backside, and wherein a region between the first drift zone and the first substrate comprises a highly conductive structure providing a low ohmic connection between the first drift zone and the first substrate. Further, a method for producing such a device is provided.

25 Claims, 10 Drawing Sheets

SEMICONDUCTOR DEVICE AND METHOD FOR PRODUCING THE SAME

TECHNICAL FIELD

This specification is directed to methods for forming a semiconductor device. Furthermore, this specification describes embodiments of FET semiconductor devices, in particular two complementary FETs on a common substrate.

BACKGROUND

Field effect transistors (FETs) are included in semiconductor chips for a vast variety of semiconductor device applications. For example, in motor drivers, DC-converters and rectifiers, FETs are used as semiconductor switches in a half-bridge configuration that includes a low-side switch and a high-side switch. In view of further developments of these applications, there is a need for increasing the integration level while ensuring appropriate device characteristics.

These solutions are frequently construed with discrete chips having a low-side switch and a high-side switch with a charge pump, or with discrete components in a common housing. In the case of variants with discrete chips, the leakage inductance is frequently disadvantageously high due to the relatively long connections, which causes high switching losses. Integrated discrete chips in a common housing reduce this problem, however, there is still a need for a further reduction of the leakage inductance.

It is common to build a half bridge employing an n-channel MOSFET as a low-side switch and a p-channel MOSFET or n-channel MOSFET with a charge pump as the high-side switch. If the bridge is built into in a common housing, the power switches, in the case of two n-channel transistors in the BE, have to be bonded separately onto the leadframe. This leads to increased costs per package.

In the case of a half bridge with a p-MOSFET as the high-side switch, the separation of the leadframe is not necessary, however, two chips require significantly more space and also cause higher costs for the assembly.

For these and other reasons there is a need for the present invention.

SUMMARY

Embodiments of the invention include a power semiconductor device. The device comprises a first substrate that is highly doped with a first dopant type, the first substrate having a front face and a back face, the back face forming a backside of the device, a vertical p-type FET and a vertical n-type FET provided laterally adjacent to each other on the front face of the first substrate, wherein one of the FETs has a first drift zone with a complementary doping to the first dopant of the first substrate, a complementary highly doped second region provided between the complementary second drift zone and the first substrate, wherein the p-type FET and the n-type FET share the first substrate as a common backside, and wherein a region between the complementary second drift zone and the first substrate, including at least a part of the complementary highly doped second region, comprises a highly conductive structure providing a low ohmic connection between the complementary second drift zone and the first substrate.

Further embodiments pertain to a method for producing a power semiconductor device. The method comprises providing a highly doped substrate with a first dopant type, providing at least one p-type drift zone and at least one n-type drift zone laterally adjacent to each other, wherein at least one first drift zone has a complementary doping to the first dopant type of the first substrate, providing a highly conductive structure in a region located between the first drift zone and the highly doped substrate, providing at least one vertical FET employing the at least one p-type drift zone and at least one vertical FET employing the at least one n-type drift zone, the FETs employing the highly doped substrate as a common backside.

Yet further embodiments pertain to a method for producing a power semiconductor device. This method comprises providing a first carrier wafer comprising a standard semiconductor material with a first doping, etching a first region for a first drift zone in a front surface of the carrier wafer, epitaxially growing a first drift zone in the first region, having a complementary doping to the doping of the carrier wafer, such that the carrier wafer has p-doped and n-doped regions on its front surface, implanting high doses of a p-dopant and n-dopant into a thin layer on the front surface of the p-doped and n-doped regions, respectively, providing a highly conductive structure in the region comprising the standard semiconductor material, protruding vertically from the highly doped front surface region into the standard semiconductor material, bonding a highly doped second carrier wafer, having a complementary doping to the first carrier wafer, to the front surface of the first carrier wafer, thinning the first carrier wafer, providing at least one vertical FET employing the at least one p-type drift zone and the at least one vertical FET employing the at least one n-type drift zone, wherein the FETs employ the p-doped and n-doped regions of the first carrier wafer as drift zones and employ the second carrier wafer as a common backside electrode.

Yet further embodiments pertain to another method for producing a power semiconductor device. This method comprises providing a carrier wafer that is highly doped with a first dopant type, having a front surface and a back surface, selectively growing a first $SiO_2$ layer on a part of a front surface of the carrier wafer, epitaxially growing a first device layer having a standard doping of the same dopant type as the carrier wafer on the front surface of the carrier wafer not covered with $SiO_2$, providing a second $SiO_2$ layer over the first device layer, covering a front surface and the side walls of the first device layer, selectively back etching the first $SiO_2$ layer until the carrier wafer is exposed, providing a highly doped second region of an opposite dopant type to that of the carrier wafer on the exposed area, providing a highly conductive structure in the region of the highly doped second region, protruding vertically from the highly doped second region into the highly doped carrier wafer, epitaxially growing a second device layer with a standard doping of the complementary type as the doping of the first device layer on the highly doped second region, until the second device layer has the same level as the laterally adjacent first device layer, back etching the second $SiO_2$ layer until the first device layer is exposed, providing at least one vertical FET, employing the first device layer as a first drift zone, and at least one complementary vertical FET employing the second device layer as a second drift zone, on the first and second device layers, respectively, wherein the FETs employ the highly doped carrier wafer as a common backside electrode.

These and other embodiments are illustrated in the attached drawings and described in detail below. Accordingly, those skilled in the art will recognize additional features and advantages of the present invention upon reading the following detailed description and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
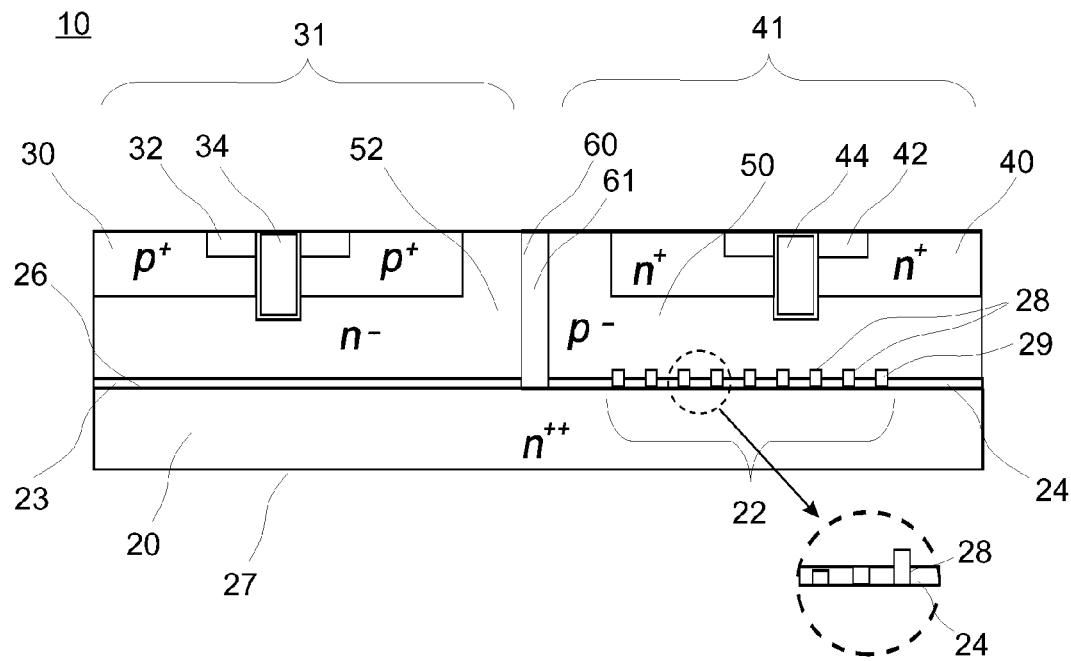
FIG. 1 schematically illustrates a semiconductor device according to one or more embodiments.

In the following Detailed Description, reference is made to the accompanying drawings, which form a part hereof, and in which are shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" or "lateral" as used in this specification intends to describe an orientation substantially parallel to a first or main horizontal surface of a semiconductor substrate or body. This can be, for instance, the surface of a wafer or a die. Further, the terms "complementary second drift zone" and "drift zone with a complementary doping" are used interchangeably herein.

The term "vertical" as used in this specification is intended to describe an orientation which is substantially arranged perpendicular to the first surface, i.e., parallel to a normal direction with respect to the first surface of the semiconductor substrate or body.

In this specification, an n-doped material or region is referred to as having a first conductivity type, while a p-doped material or region is referred to as having a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n-" means a doping concentration that is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+ regions can have different absolute doping concentrations. The same applies, for example, to an n+ and a p+ region.

Specific embodiments described in this specification pertain to, without being limited thereto, field effect transistors, and in particular pertain to power field effect transistors. The term "field-effect," as used in this specification, is intended to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in ohmic contact with a drain or collector electrode. The source region or emitter region is in ohmic contact with a source or emitter electrode. Without applying an external voltage between the gate electrode and the source or emitter electrode, the ohmic current path between the source or emitter electrode and the drain or collector electrode through the semiconductor device is broken or at least high-ohmic in normally-off field effect devices. In normally-on field effect devices such as HEMTs (High Electron Mobility Transistors), depletion MOSFETs (Metal Oxide Field Effect Transistors) and normally-on JFETs (Junction-FETs), the current path between the source electrode and the drain electrode through the semiconductor device is typically low-ohmic without applying an external voltage between the gate electrode and the source or emitter electrode.

In the context of the present specification, the term "field-effect structure" is intended to describe a structure formed in a semiconductor substrate or semiconductor device having a gate electrode for forming and or shaping a conductive channel in the channel region. The gate electrode is at least insulated from the channel region by a dielectric region or dielectric layer.

The terms "depleted" and "completely depleted" are intended to describe that a semiconductor region comprises substantially no free charge carriers. Typically, insulated field plates are arranged close to pn-junctions formed, e.g., between a drift region and a body region. Accordingly, the blocking voltage of the pn-junction and the semiconductor device, respectively, may be increased. The dielectric layer or region that insulates the field plate from the drift region is in the following also referred to a field dielectric layer or field dielectric region. The gate electrode and the field plate may be on same electrical potential or on different electrical potential. The field plate may be on source or emitter potential. Furthermore, a portion of the gate electrode may be operated as field electrode.

Examples of dielectric materials for forming a dielectric region or dielectric layer between the gate electrode or a field plate and the drift region include, without being limited thereto, $SiO_2$, $Si_3N_4$, $SiO_xN_y$, $Al_2O_3$, $ZrO_2$, $Ta_2O_5$, $TiO_2$ and $HfO_2$, as well as mixtures and/or layers or liners of these materials.

Embodiments described herein generally relate to devices with vertical MOS transistors on a common substrate. More particularly, they relate to semiconductor devices having at least two drift zones with complementary doping, provided on a common carrier wafer or substrate having a doping of the same type as a first one of the drift zones, and thus of the opposite type to the second, or other, drift zone. In order to obtain a low ohmic connection between both of the drift zones and the substrate, it is proposed to provide a highly conductive structure between the drift zone having the dopant type opposite to the substrate, and the substrate. In embodiments, various options are provided for realizing and producing the highly conductive structure, as well as various methods for producing such a structure. Typically, the highly conductive structure extends at least for a part of its vertical length through a complementary doped highly doped second region (or layer) between the drift zone having the dopant type complementary to the substrate, and the substrate.

Embodiments pertain to the provision of trenches in a region between the substrate and the drift zone, the trenches being filled with highly conductive material. These may be, for example, a carbon modification, preferably graphite, a ternary nitride, a ternary silicide, metals such as Mo, W, Cu, a eutectic material, and metal silicide. Also, combinations of the former are possible. Embodiments further pertain to implanting defect atoms or ions in a transition region between a highly doped second region, located between the substrate and the drift zone, and the substrate. By implanting a sufficiently high dopant concentration, the characteristics of the pn-transition region—between the highly doped second region located on a face of the drift zone with a doping of an opposite type to that of the common substrate—and the common substrate may be adapted to be a conducting region.

FIG. 1 shows a power semiconductor device 10 according to embodiments. It comprises a first substrate 20 that is highly doped with a first dopant type, typically, but not necessarily an n++ doping as shown. It goes without saying that all dopings and dopant types described and shown in the present disclosure in various embodiments can also be realized with the complimentary doping characteristics, that is, n and p are generally interchangeable, unless otherwise stated in the individual examples. The first substrate 20 has a front face 26 and a back face 27, wherein the back face forms a backside of the semiconductor device 10.

A vertical n-type FET 31, having a first body region 30, a first source region 32, a first drift zone 52, and a first gate 34, and a vertical p-type FET 41, having a second body region 40, a second source region 42, a second drift zone 50, and a second gate 44, are provided laterally adjacent to each other on the front face 26 of the first substrate 20. In the exemplary embodiment shown, p-type FET 41 has a second drift zone 50 with a complementary p-doping to the first dopant type (n++) of the first substrate 20, henceforth also called complementary second drift zone 50. The n-type FET 31 and the p-type FET 41 share the first substrate 20 as a common backside. It goes without saying that in the shown configuration with at least two transistors of complementary types arranged on a common doped substrate, one of the drift zones 50, 52 (or drift regions) necessarily has the complementary dopant type of the substrate.

In the exemplary embodiment of FIG. 1, the first substrate 20 is also the common backside electrode of the n-type FET 31 and the p-type FET 41. The complementary second drift zone 50 ends in a highly complementary doped region 24. A transition region exists between the highly complementary doped region 24 and the first substrate 20. The highly conductive structure 22 is provided to electrically shortcut this transition region. The highly conductive structure 22 extends at least for a part of its vertical dimension through the highly complementary doped region 24. The structure provides a low ohmic connection between the complementary highly doped region 24 and the first substrate 20, and at the same time between the complementary second drift zone 50 and the first substrate 20. To this end, the highly conductive structure 22 comprises at least one trench 28, preferably a plurality of vertical trenches 28 as shown, protruding between the complementary second drift zone 50 and the substrate 20. The at least one trench 28 is lined or filled with a conductive material 29. The trenches 28 of the highly conductive structure 22 form a low ohmic connection between the complementary highly doped (in the example p++) second region 24, in the non-limiting example of FIG. 1 having a p-doping, and the first substrate 20, in FIG. 1 having an n++ doping. The trenches 28 thus short-circuit the pn-transition region between the complementary highly doped second region 24 and the first substrate 20, which would without the trenches 28, respectively without the highly conductive structure 22, cause a significant voltage drop when a current is flowing through p-type FET 41. Thus, the highly conductive structure 22 diminishes or short-cuts the diode effect of the pn-transition region between the complementary highly doped second region 24 and the first substrate 20. The trenches 28 of the highly conductive structure 22 may extend vertically throughout the entire complementary highly doped region 24, or may extend only through a part of it, and thus each have at least one vertical end in the complementary highly doped second region 24. Three non-limiting examples for relative dimensions of the trenches 28 of the highly conductive structure 22 are shown schematically in the circle with a dashed line depicted in FIG. 1. The foregoing description of the structure and depth of the highly conductive region 22 pertains also to other embodiments described herein, which employ trenches 28 in the highly conductive structure. In analogy, the same applies for example also to the highly conductive structure 21 employing implanted defect atoms, as shown with respect to FIG. 2 below, in a highly doped second region and optionally also the drift zone. With embodiments described herein, it is possible to apply drift zones 50, 52, or more generally speaking semiconductor material, of complementary dopant types to a common substrate, whereby at the same time, an unwanted voltage drop or voltage loss at the obligatory pn-transition region between one of the drift zones or materials and the common substrate is greatly reduced. Hence, an improved solution for placing vertical field effect transistors, in particular MOS type transistors of different channel types on a common substrate is provided. Regardless of the individual shape and design of the highly conductive structure 21, 22, in embodiments it extends vertically in a region between, or including parts of, the complementary second drift zone 50 and the first substrate 20. Thereby, the highly conductive structure 22 includes at least a part of, and at least partly overlaps with, the complementary highly doped second region 24. The highly conductive structure 22 may in a vertical direction also extend entirely in the complementary highly doped second region 24, wherein it may also possess at least one vertical end located in the complementary highly doped second region 24.

Typically, the at least one trench 28 is lined or filled with a conductive material 29, which may include a carbon modification, preferably graphite, a ternary nitride, a ternary silicide, Mo, W, Ti an eutectic material, and a metal silicide. Also, combinations or mixtures of the former are possible.

The FETs 31, 41 are typically laterally isolated from each other. This may typically be achieved by an isolation trench 60, which is filled or lined with an isolating material 61, and/or which may comprise a void.

Figure 2:
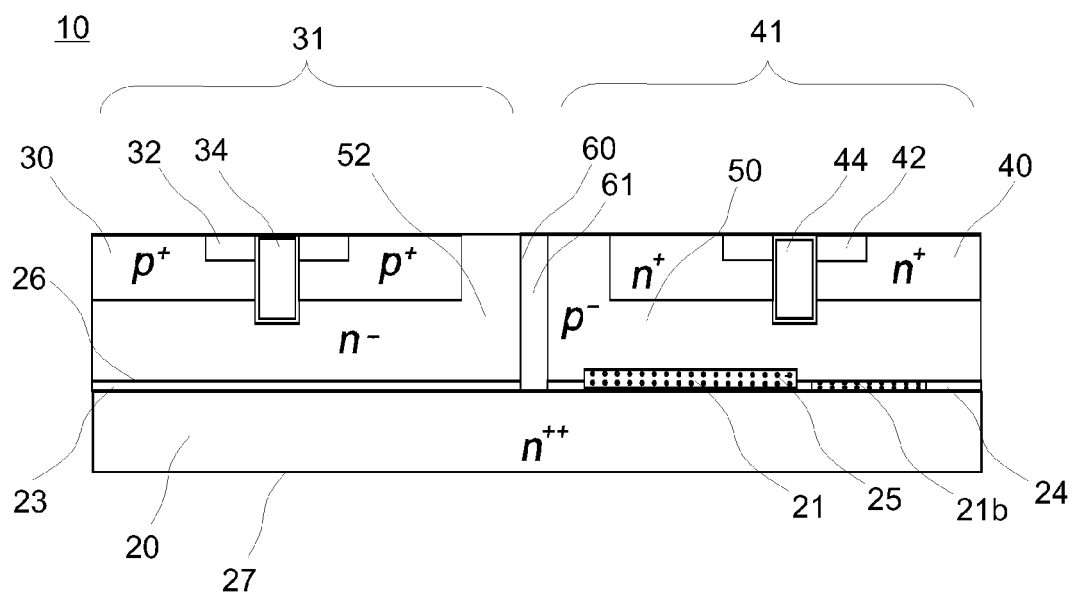
FIG. 2 schematically illustrates a semiconductor device according to one or more embodiments.

According to embodiments as shown in FIG. 2, a highly conductive structure 21 is realized differently from the highly conductive region 22 shown in FIG. 1. Typically, the highly conductive structure 21 of FIG. 2 comprises implanted defect atoms 25 (only schematically shown) in a transition region between the complementary second drift zone 50 or the complentary highly doped region 24 and the first substrate 20. The implanted defect atoms 25 act as defects in the semiconductor material. They lead to an elevated number of energy levels in the band gap. As a result, they enable a high conductivity between the complementary second drift zone 50, respectively the highly doped second region 24, and the first substrate 20. Suitable choices for the defect atoms are, for example, Se, S, and Ar. The highly conductive structure 21b may also extend entirely within the complentary highly doped region 24. The two variants 21 and 21b are to be seen as alternatives, which are only shown together in FIG. 2 for illustrational purposes. However, in embodiments, they may also be combined.

In the case of Se, the effectiveness of the defect generation is particularly high in the end-of-range of the deposition of the atoms. That is, the effect of the defect generation per number of defect atoms is higher than with many other types of defect atoms. Further, the Se generated defects are very stable against high temperatures. This is partly due to the formation of Se clusters in the vicinity of the surface of the treated material. In the present embodiments, this is typically the surface of complementary second drift zone 50, respectively of the p-doped semiconductor material that forms complementary second drift zone 50 after production of the semiconductor device 10, on the surface of which there is a highly doped second region 24 or layer of the same dopant type. Suitable doses for the concentration of the Se defect atoms in the semiconductor material of the drift zone 50, respectively the highly doped second region 24, are from about $2\times10^{13}$ to about $2\times10^{15}$ Se atoms per $cm^3$, more specifically from about $4\times10^{13}$ to about $1.5\times10^{15}$ Se atoms per $cm^3$. In the case of Ar as a defect material, the applied doses are typically about one order of magnitude higher. Thus, the range of concentration is from about $2\times10^{14}$ to about $2\times10^{16}$ Ar atoms per $cm^3$, more specifically from about $4\times10^{14}$ to about $1.5\times10^{16}$ Ar atoms per $cm^3$. It is generally desirable to deposit the defect concentration as exactly as possible at the pn-transition region between the complementary second drift zone 50, respectively the highly doped second region 24 on its surface, and the first substrate 20. To this end, an implantation energy of the atoms or ions is chosen to be relatively low. A suitable range for the implantation energy is from about 5 keV to about 60 keV, more typically from about 10 keV to about 50 keV. The implantation of the defect atoms is typically carried out before the first substrate 20 and the semiconductor material of the drift zones 50, 51 are joined, which is described further below. In embodiments, a thin layer (not shown) may be epitaxially grown on the surface which is the target for the deposition, such that it is possible to implant through the thin layer, such that the atoms stop just behind the thin layer directly at the surface of the semiconductor material of the drift zone 50, respectively in the highly doped second region 24 or layer on the surface of drift zone 50.

In embodiments, the highly conductive structure 21 of FIG. 2 may also comprise a Si—Ge-graded epitaxial hetero structure located at the border between the drift zone 50 and the first substrate 20.

Figure 3:
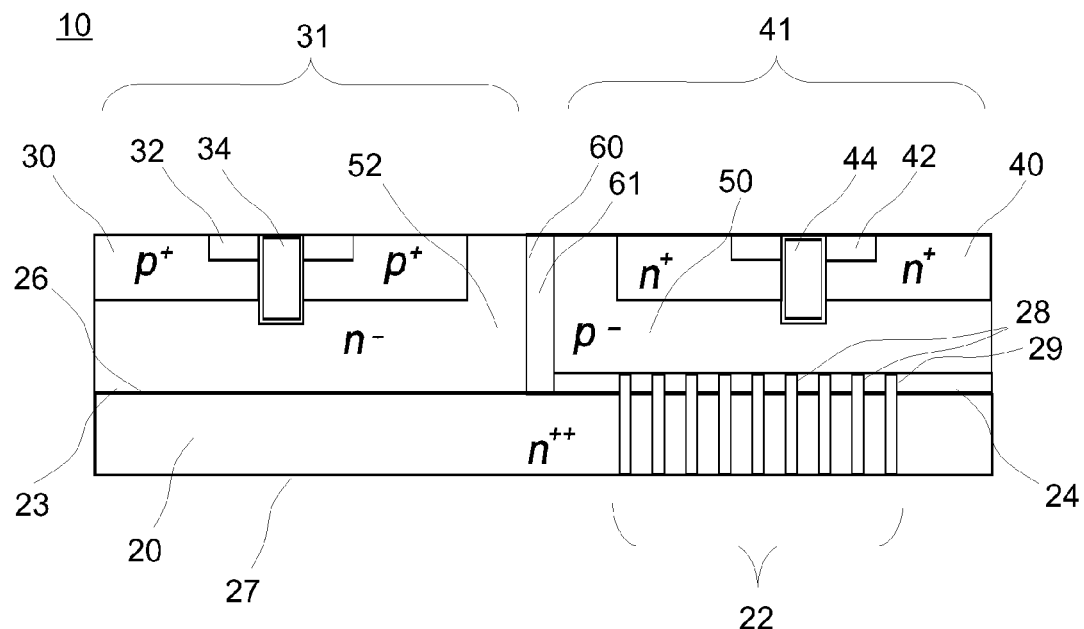
FIG. 3 schematically illustrates a semiconductor device according to one or more embodiments.

According to embodiments as shown in FIG. 3, a highly conductive region 22 may also be achieved by employing trenches 29, somewhat similar as in the embodiments of FIG. 1. However, according to embodiments as depicted in FIG. 3, the trenches are etched from the backside 27 of semiconductor device 10, typically at the end of the manufacturing process. They are subsequently filled with a conductive material 28. This may typically be a metal or a metal silicide, such as Cu, W, Ti, TiTiN, Mo, Ta, MoSi, TaSi, or TiSi.

Figure 4:
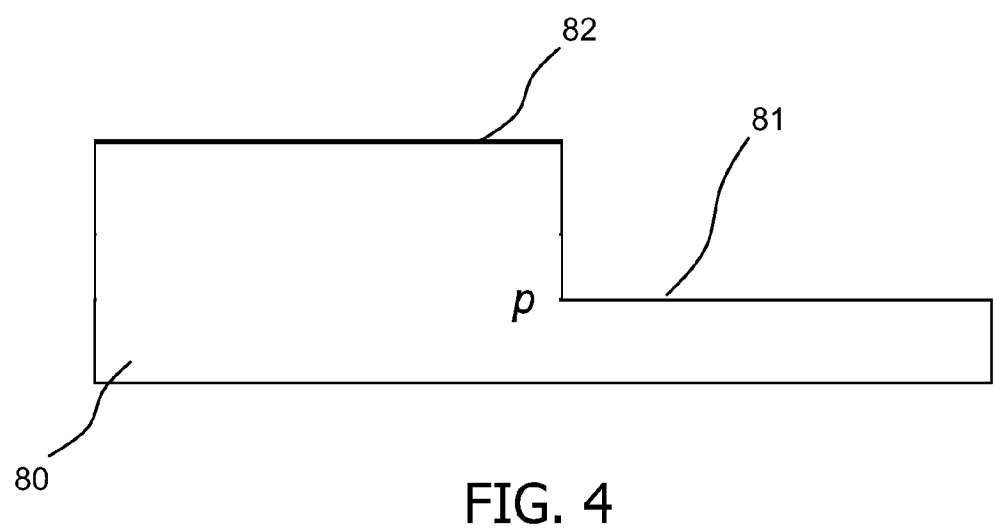
FIG. 4 to FIG. 10 schematically show a method for producing a semiconductor device according to embodiments.
Figure 5:
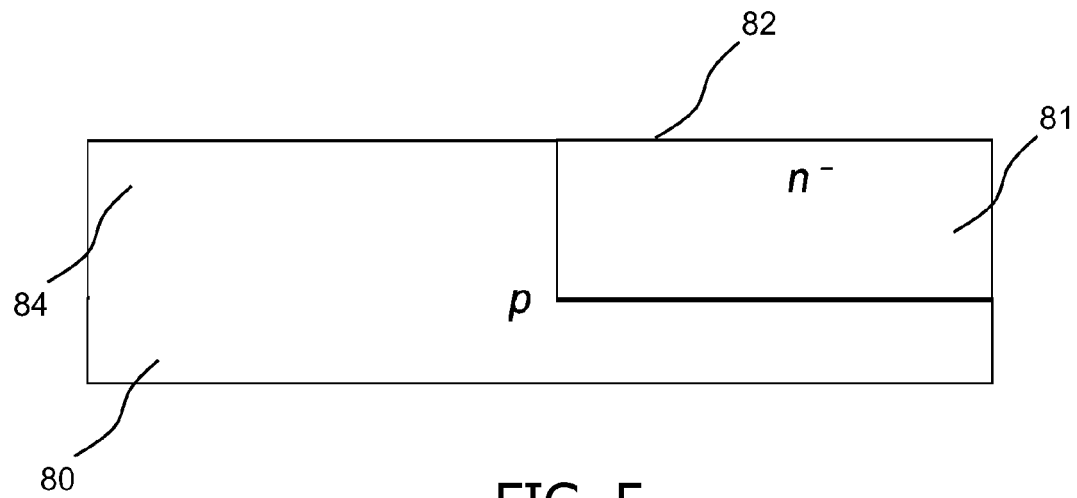

FIG. 4 shows a first step of a method of producing a semiconductor device 10 according to embodiments. A first carrier wafer 80 comprising a standard semiconductor material with a first doping is provided. Exemplarily, the first doping is a p-doping in FIG. 4. Employing a trench process or Bosch process, a trench 81 for a first drift zone is produced in a front surface 82 of the carrier wafer 80, see FIG. 4. As shown in FIG. 5, the trench 81 is then filled with epitaxially grown semiconductor material 84 having a complementary doping to that of carrier wafer 80, hence the epitaxially grown material 84 is n-doped. The carrier wafer 80 afterwards has p-doped and n-doped regions on its front surface 82.

Figure 6:
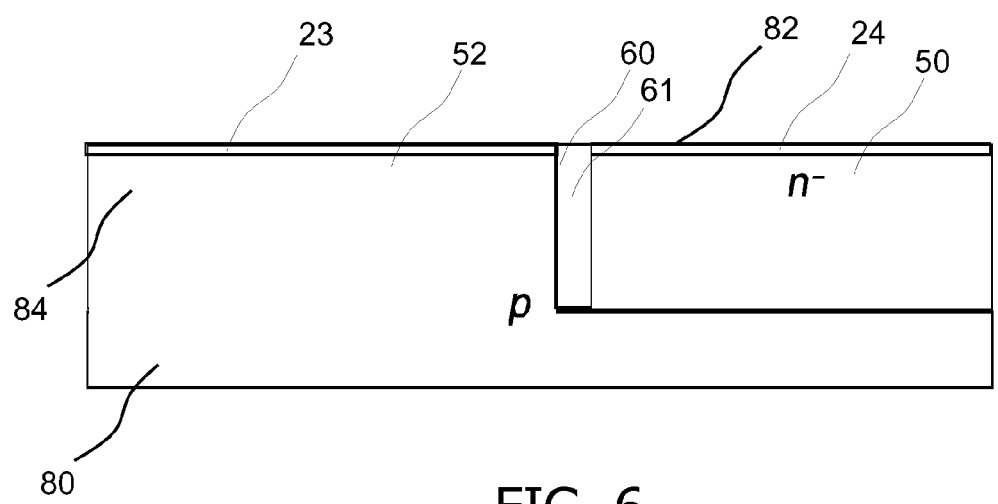

FIG. 6 shows that an isolation trench 60 has been etched into wafer 80 between the epitaxially grown material 84 and, in a lateral direction, a p-doped region of the standard semiconductor material of the wafer 80. The isolation trench 60 is lined or filled. The lining or filling material 61 at least comprises an isolating material, for example a lining with an oxide layer, a filling with polysilicon, and/or a void, such that areas of the device abutting the trench laterally are isolated from each other by the trench 60.

Also, FIG. 6 shows that high doses of a p-dopant and n-dopant are implanted in layers on the front surface 82 of the p-doped region 50 and the n-doped region 52, respectively, resulting in highly doped layers 23, 24. The purpose of the layers 23 and 24 is to provide a good ohmic contact from 82 to the bonded wafer 20.

Figure 7:
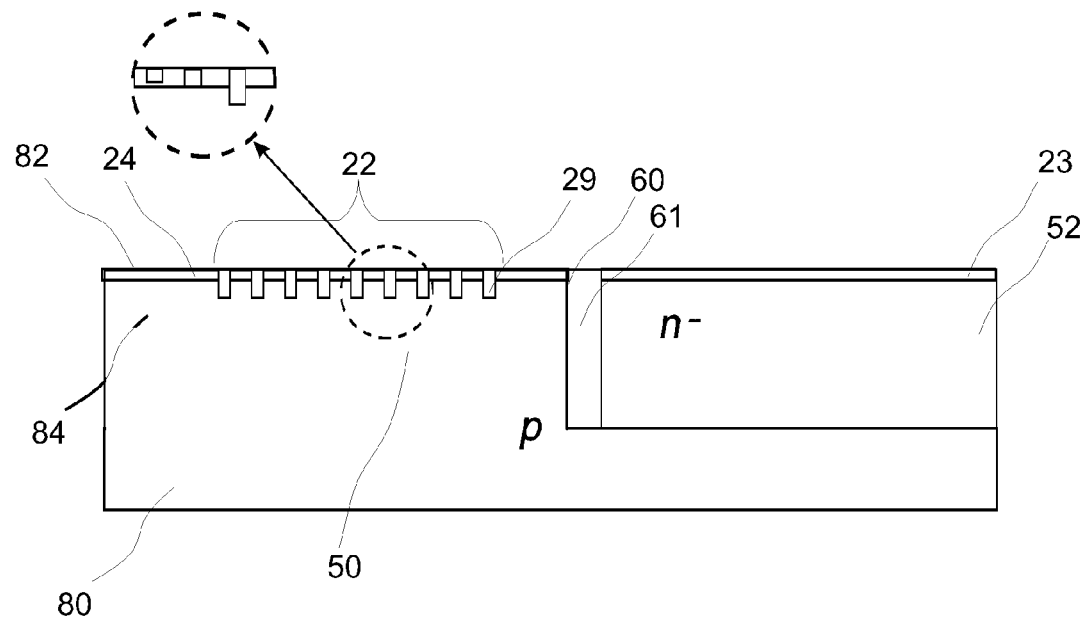

FIG. 7 shows how a highly conductive structure 22 is applied according to embodiments, similar to the one depicted in FIG. 1. The highly conductive structure 22 is located in the standard semiconductor material of wafer 80, protruding vertically from the highly doped second region 23 on the front surface 82 into the standard p-doped semiconductor material of wafer 80. The structure 22 will later, when the device is finished, provide a low ohmic connection between the complementary second drift zone 50 and the first substrate 20 (not yet present in FIG. 7). To this end, the highly conductive structure 22 comprises at least one trench 28, preferably a plurality of vertical trenches 28 as shown. The at least one trench 28 is lined or filled with a conductive material 29.

Figure 8:
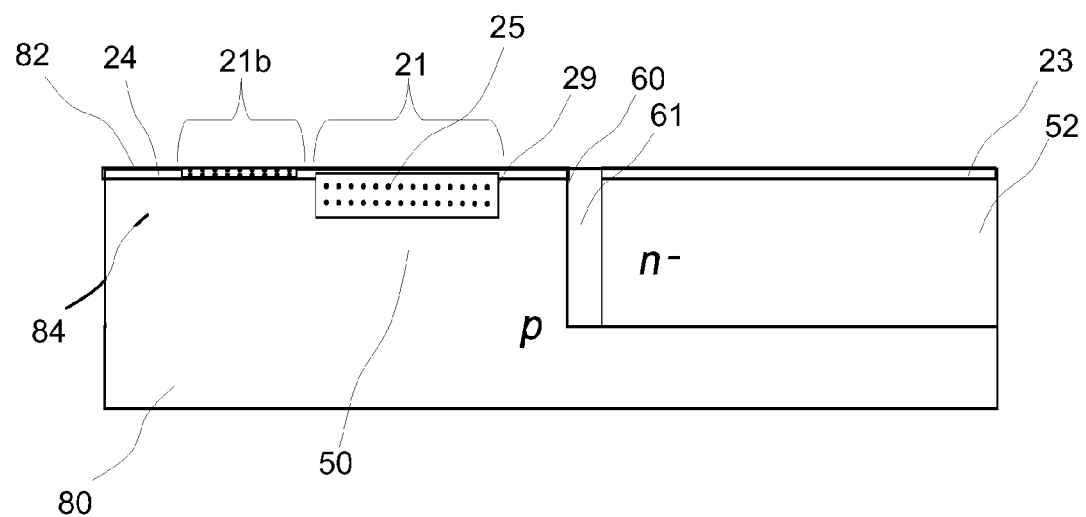

In FIG. 8, the alternative production of another type of highly conductive structure is shown, which may be realized by implanting defect atoms 25. Typically, the highly conductive structure 21 of FIG. 8 (similar to that of FIG. 2) comprises implanted defect atoms 25 (only schematically shown) in a transition region between the complementary second drift zone 50, respectively the highly doped second region 24, and the first substrate 20 (not shown), which will be added in FIG.

9. The implanted defect atoms 25 act as defects in the semiconductor material. They lead to an elevated number of energy levels in the band gap. As a result, they enable a high conductivity between the complementary second drift zone 50 and the first substrate 20. Suitable choices for the defect atoms are, for example, Se, S, and Ar.

In the case of Se, the effectiveness of the defect generation is particularly high in the end-of-range of the deposition of the atoms. That is, the effect of the defect generation per number of defect atoms is higher than with many other types of defect atoms. Further, the Se generated defects are very stable against high temperatures. This is partly due to the formation of Se clusters in the vicinity of the surface of the treated material. In the present embodiments, this is typically the surface of complementary second drift zone 50, respectively the highly doped second region 24 formed on the p-doped semiconductor material which forms complementary second drift zone 50 after production of the semiconductor device 10. Suitable doses for the concentration of the Se defect atoms in the semiconductor material of the drift zone 50 are from about $2 \times 10^{13}$ to about $2 \times 10^{15}$ Se atoms per $cm^3$, more specifically from about $4 \times 10^{13}$ to about $1.5 \times 10^{15}$ Se atoms per $cm^3$. In the case of Ar as a defect material, the applied doses are typically about one order of magnitude higher. Thus, the range of concentration is from about $2 \times 10^{14}$ to about $2 \times 10^{16}$ Ar atoms per $cm^3$, more specifically from about $4 \times 10^{14}$ to about $1.5 \times 10^{16}$ Ar atoms per $cm^3$. It is generally desirable to deposit the defect concentration as exactly as possible at the pn-transition region between the complementary second drift zone 50, or the highly doped second region 24 formed thereon, and the first substrate 20. To this end, an implantation energy of the atoms or ions is chosen to be relatively low. A suitable range for the implantation energy is from about 5 keV to about 60 keV, more typically from about 10 keV to about 50 keV. The implantation of the defect atoms is typically carried out before the first substrate 20 and the semiconductor material of the drift zones 50, 51 are joined, which is described below with respect to FIG. 9. In embodiments, a thin layer (not shown) may be epitaxially grown on the surface, which is the target for the deposition, such that it is possible to implant through the thin layer, such that the atoms stop just behind the thin layer directly at the surface of the semiconductor material of the drift zone 50.

In embodiments, the highly conductive structure 21 of FIG. 8 may also be realized by applying a Si—Ge-graded epitaxial hetero structure to the border between the drift zone 50 and the first substrate 20.

Figure 9:
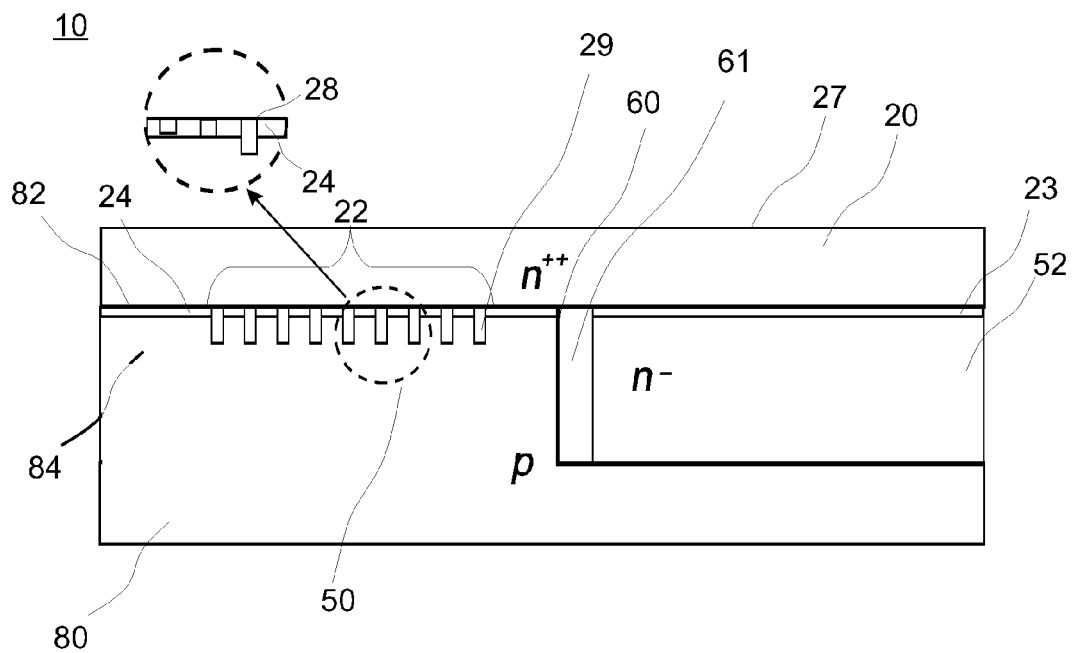

In FIG. 9, it is shown how the prepared wafer 80 including the highly conductive region 22 from FIG. 7 is joined with a n++ doped carrier wafer, which in the following is called substrate 20. The substrate 20 is bonded to wafer 80 by a wafer bonding process. The at least one trench 29 now forms a low ohmic connection between the complementary second drift zone 50, having a p-doping, and the n++ doped substrate 20, short-cutting the pn-transition region there between. A similar process is carried out (not shown) with the wafer from FIG. 8, comprising defect atoms as the highly conductive region 21, when it is waferbonded with substrate 20 (not shown). Subsequently, after the wafer 80 and the substrate are bonded, the back face 27 of substrate 20 is treated by chemical-mechanical polishing (CMP). The substrate 20 forms also a back face 27 of the produced semiconductor device 10, to which metal contacts are subsequently attached.

Figure 10:
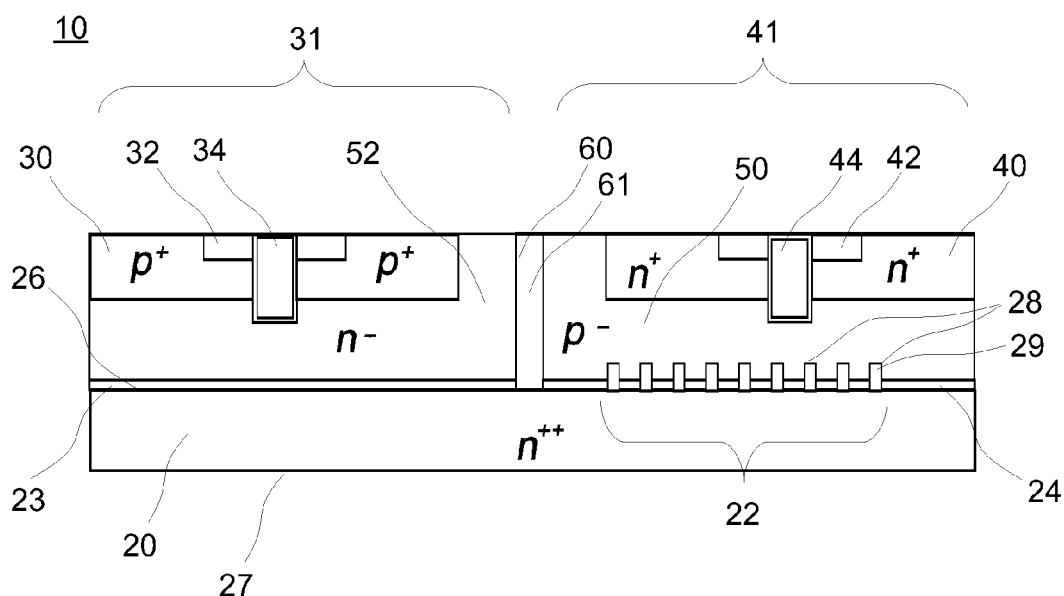

In FIG. 10, the structure from FIG. 9 is shown upside down. The wafer 80 has been thinned from its backside down to the vertical height of the isolation trench 61. Consequently, two distinct areas, namely the first drift zone 52 and the second complementary drift zone 50 are completely separated by the trench 60 after the thinning. Subsequently, n-type and p-type FET transistors 31, 41 are produced in the first drift zone 52 and in the second complimentary drift zone 50. The vertical n-type FET 31, having a first body region 30, a first source region 32, a first drift zone 52, and a first gate 34, and the vertical p-type FET 41, having a second body region 40, a second source region 42, a complementary second drift zone 50, and a second gate 44, are located laterally adjacent to each other on the front face 26 of the first substrate 20. In the exemplary embodiment shown, p-type FET 41 has a second drift zone 50 with a complementary p-doping to the first dopant type (n++) of the first substrate 20, henceforth also called complementary second drift zone 50.

Figure 11:
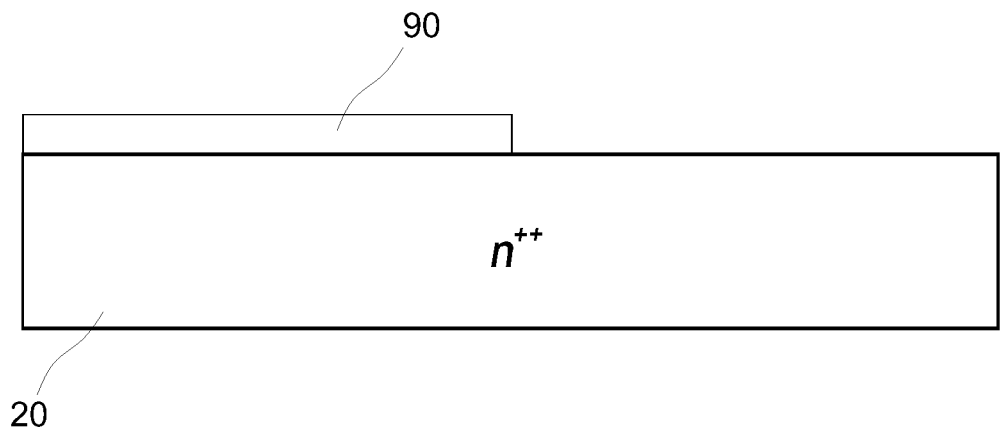
FIGS. 11 to 16 schematically show a further method for producing a semiconductor device according to embodiments.

In FIG. 11, a first step of a further method for producing a semiconductor device 10 according to embodiments such as shown in FIG. 1, FIG. 2, and FIG. 3 is shown. First, a carrier wafer is provided, which is strongly doped with a first dopant type, in this exemplary embodiment n++. In the following, this carrier wafer is also called first substrate 20. On a front face of that substrate 20, an oxide layer 90 from a semiconductor oxide, $SiO_2$ in the illustrated embodiment, is selectively deposited, such that a part of the face of the first substrate 20 is not covered by the oxide layer 90.

Figure 12:
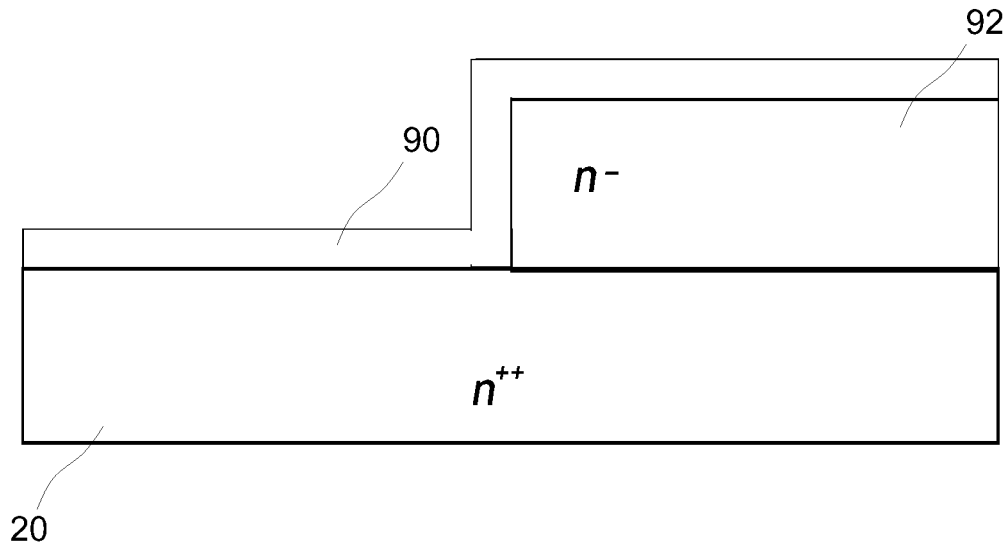

In FIG. 12, a layer having the same doping type as the first substrate 20, but in a standard concentration, has been epitaxially grown on the face of the first substrate 20 not covered by the semiconductor oxide 90. Subsequently, the oxide layer is extended to cover also the epitaxially grown device layer 92 and its vertical side wall. The device layer 92 will later have the function of a drift zone for one of the FETs.

Figure 13:
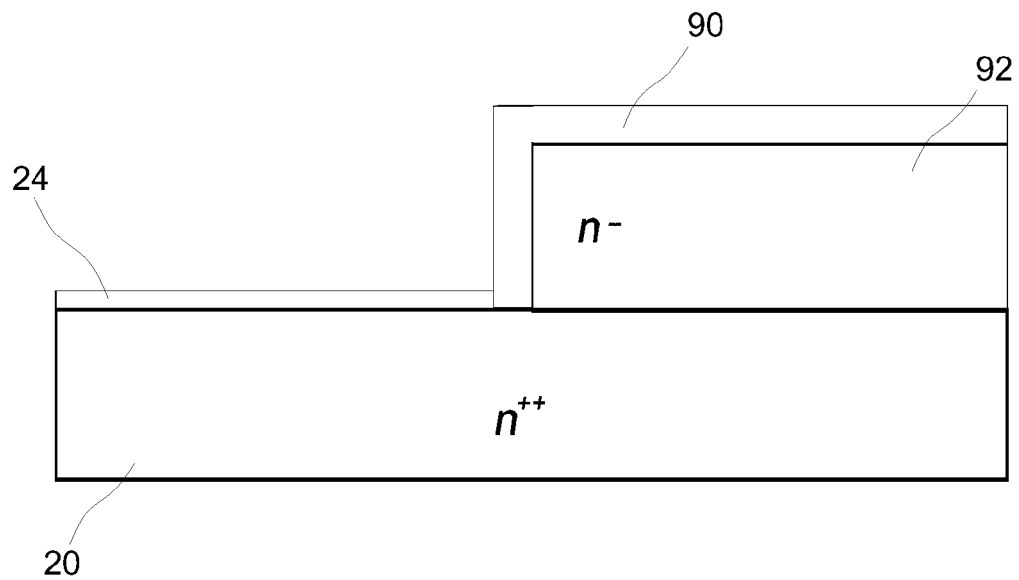

Then, the oxide layer 90 is selectively etched back until the first substrate 20 (the carrier wafer) is exposed. Thereby, the part of the oxide layer 90 covering device layer 92 and its side wall remains. The surface of the first substrate 20 uncovered in the etching process is subsequently treated with a dopant. A highly doped second region 24 of an opposite dopant type to that of the first substrate 20 is produced on the exposed area. In the shown example the doping of the highly doped second region 24 is p++, whereas the first substrate 20 is n++ doped. This status of the produced device is shown in FIG. 13.

Figure 14:
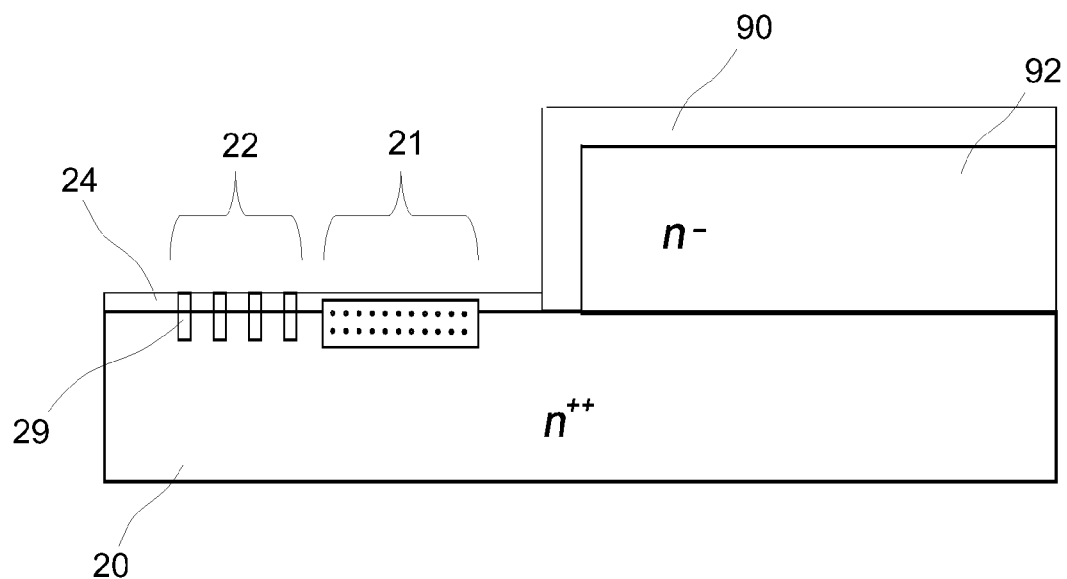

Next, as shown in FIG. 14, a highly conductive structure 21, 22 is produced in the region of the highly doped second region, protruding vertically from the highly doped second region 24 into the highly doped first substrate 20 (carrier wafer). The nature of the highly conductive structure was already laid out with respect to FIG. 1, FIG. 2 and FIG. 3, details about the production were laid out with respect to FIG. 7 and FIG. 8, for example. Thus, they are not laid out again. Just for illustrational purposes, two techniques for producing the highly conductive structure 21, 22 are combined in FIG. 14. This is producing filled trenches 29, which yields highly conductive structure 21, and by implanting defect atoms, yielding highly conductive structure 22. Differently from other embodiments already laid out, the trenches 29 are etched through the highly doped second region 24 into the first substrate 20, or only into the highly doped second region 24.

In a further step, a second device layer 94 with a standard doping of the opposite type of the first substrate 20 is epitaxially grown on the highly doped second region 24, until the second device layer 94 has the same level as the laterally adjacent first device layer 92. The oxide layer 92 is then selectively etched back until the first device layer 92 is exposed. It remains the vertical part of the oxide layer 90 which is now separating the laterally adjacent first and second device layers 92, 94. The resulting intermediate product of a semiconductor device 10 is shown in FIG. 15.

Figure 15:
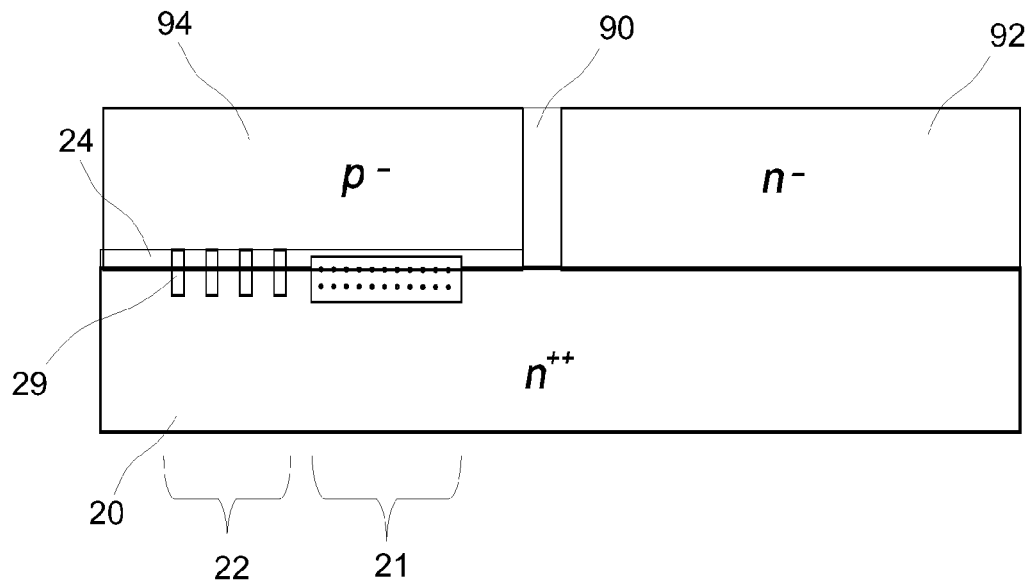
Figure 16:
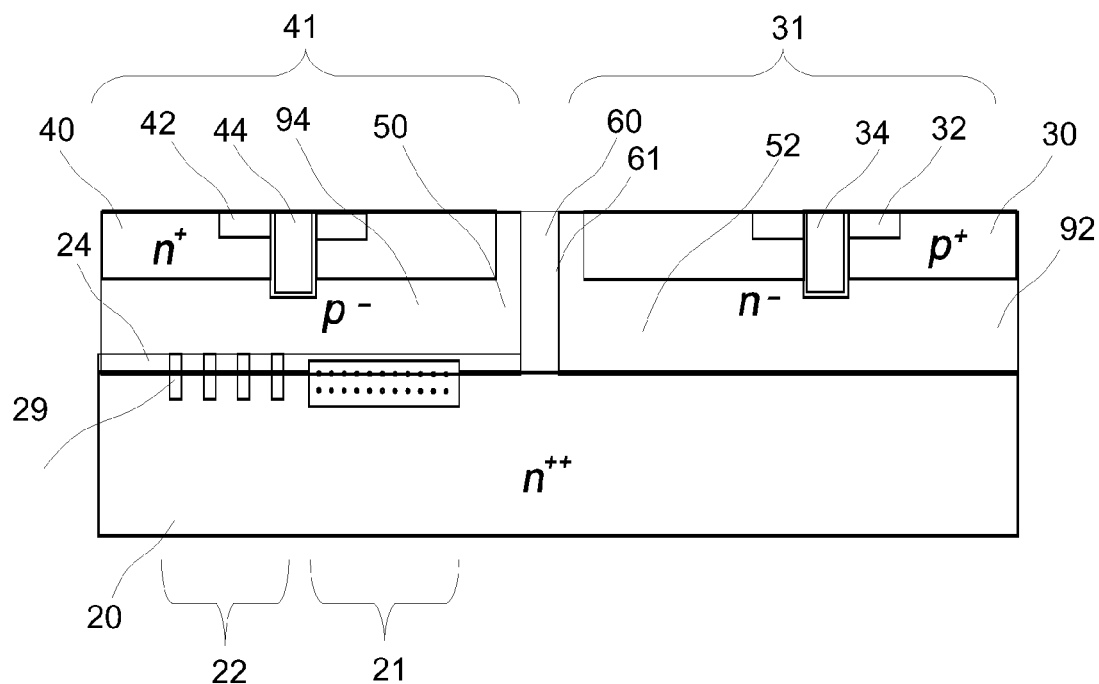

On the structure shown in FIG. 15, FETs are produced according to standard processes. In particular, at least one vertical FET 31 is provided, employing the first device layer 92 as a first drift zone 52, and at least one complementary vertical FET 41 employing the second device layer 94 as a second complementary drift zone 50, are provided on the first and second device layers 92, 94, respectively. The resulting structure, a semiconductor device 10 according to embodiments, is shown in FIG. 16.

Figure 17:
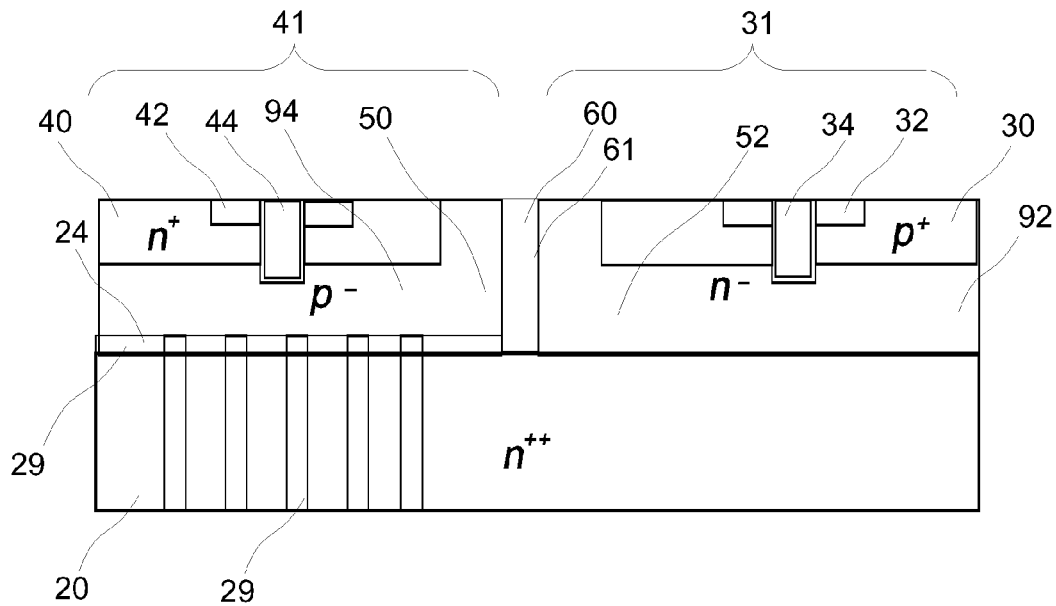
FIGS. 17 and 18, and 19 show semiconductor devices according to embodiments.

FIG. 17 shows a further semiconductor device 10 as a result of a similar production method as of the one described with respect to FIG. 13 to FIG. 16. Differing from the above, the highly conductive structure 21, 22 was not produced as shown with respect to FIG. 14, Instead, trenches 29 were etched at the end of the process, i.e., just before or after the production of the FETs 31, 41, from a backside of the first substrate 20. The trenches are filled with a conductive material, such as a metal, e.g., Cu, as already described with respect to FIG. 3.

Figure 18:
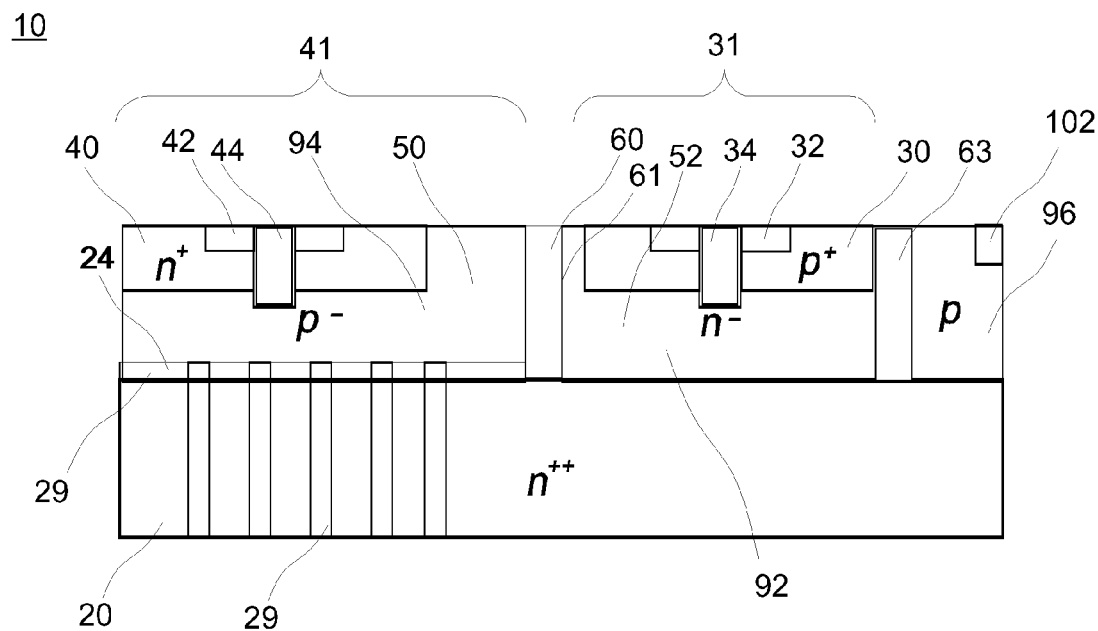

FIG. 18 shows an embodiment related to the one described with respect to FIG. 17. Additionally, during the deposition of the device layers 92, 94, as described with respect to FIG. 11 to 15, a further device layer 96, laterally isolated by an oxide-filled trench 63, has been deposited. It is p-doped, such that it is also isolated from the first substrate 20 below via the pn-transition region. In the so produced device layer 96, for example drivers, or switching logic for the FETs 31, 41 is provided. The contacting may typically be carried out in a connection layer (not shown) just above the top face of semiconductor device 10.

Figure 19:
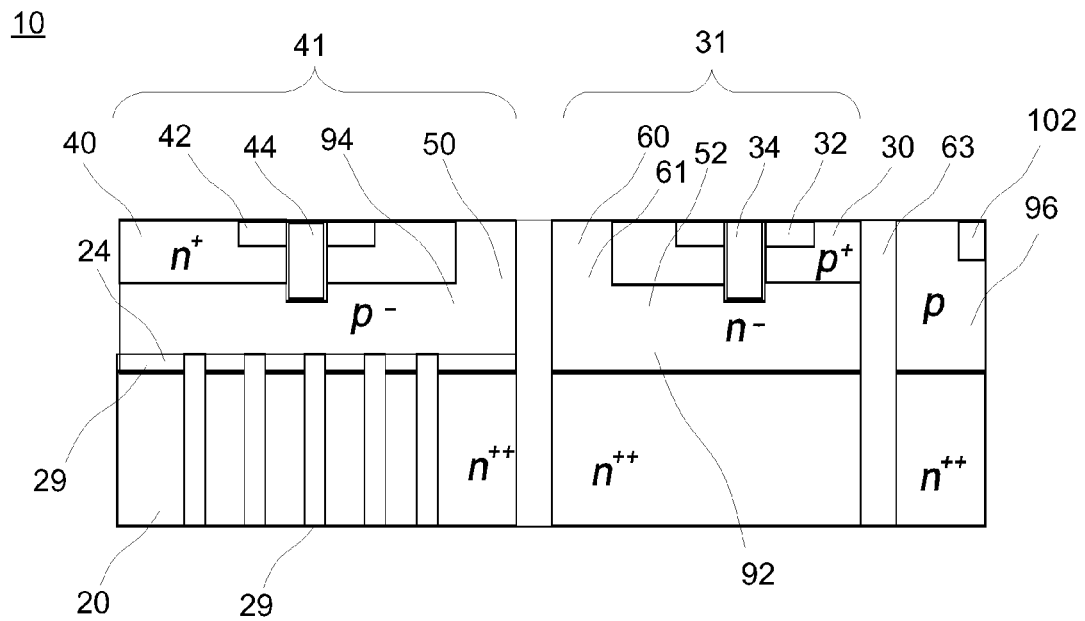

In FIG. 19, the concept of the trench-separated regions in the embodiment of FIG. 18 is further modified, in that the trenches 60, 63 protrude from a backside of the first substrate 20 (bottom of device 10) through the area of the drift zones 50, 52 respectively device layers 92, 94, 96. Hence, the regions divided by the trenches are entirely electrically separated from each other. The at least one isolated container region 96 comprises at least one driver 102 and/or logic 104 of the device.

The semiconductor devices according to embodiments can particularly be employed as half bridge configurations as typically used in power electronics.

Figure 20:
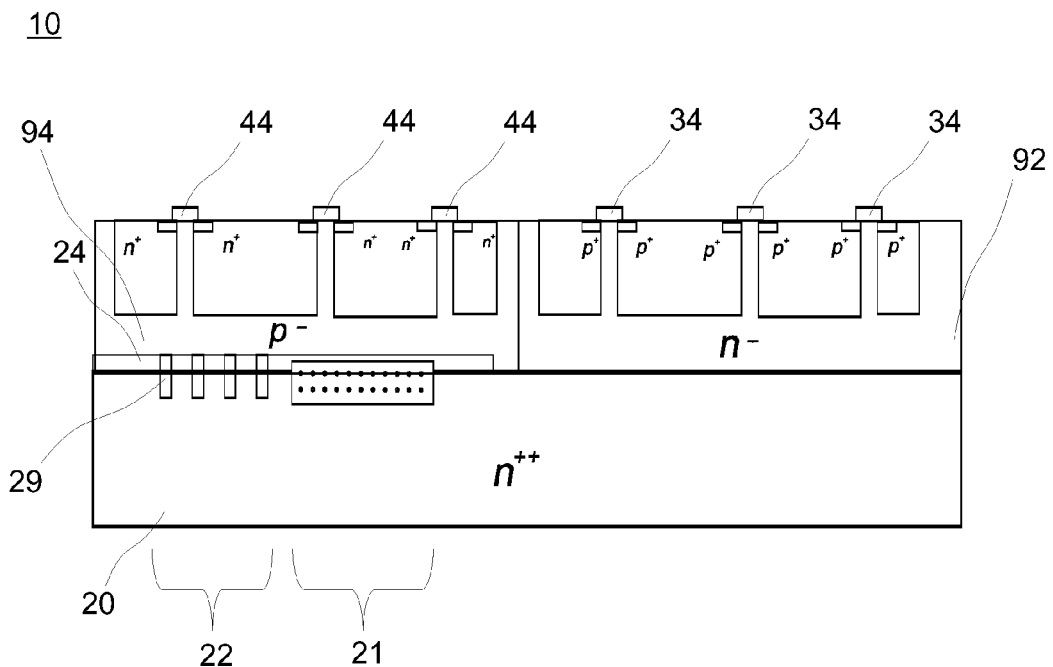
FIG. 20 shows a further semiconductor device according to embodiments based on an intermediate semiconductor product as shown in FIG. 15.

FIG. 20 shows a semiconductor device 10 according to embodiments, which is based on the intermediate product as shown in FIG. 15. The semiconductor device 10 is a device with charge compensation, also called CoolMOS. Thereby, the several gate regions 34 and gate regions 44 are coupled with each other, respectively. The characteristics of the highly conductive regions are similar to the functionality already described with respect to the embodiments of FIG. 1 and FIG. 2, for example.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A power semiconductor device comprising:
    a first substrate that is highly doped with a first dopant type, the first substrate having a front face and a back face, the back face forming a backside of the device,
    a vertical p-type FET and a vertical n-type FET provided laterally adjacent to each other on the front face of the first substrate, wherein a first of the vertical FETs has a first drift zone and a second of the vertical FETs has a complementary second drift zone with a complementary doping to the first dopant of the first substrate, and
    a complementary highly doped second region provided between the complementary second drift zone and the first substrate,
    wherein the p-type FET and the n-type FET share the first substrate as a common backside, and wherein a region between the complementary second drift zone and the first substrate, including at least a part of the complementary highly doped second region, comprises a highly conductive structure providing a low ohmic connection between the complementary second drift zone and the first substrate.

2. The device of claim 1, wherein the highly conductive structure comprises at least one vertical trench protruding between the complementary second drift zone and the first substrate.

3. The device of claim 2, wherein the at least one trench is lined or filled with a conductive material.

4. The device of claim 2, wherein a filling of the at least one trench comprises at least one of: a carbon modification, graphite, ternary nitride, ternary silicide, Mo, W, Cu, eutectic material, and metal silicide.

5. The device of claim 1, wherein the highly conductive structure comprises implanted defect atoms in a region between the complementary second drift zone and the first substrate.

6. The device of claim 1, wherein the highly conductive structure comprises defect atoms in a region between the complementary second drift zone and the first substrate, and wherein the defect atoms comprise at least one of Se, S, and Ar as defect atoms.

7. The device of claim 6, wherein the defect atoms have a density of $10^{13}$ to $10^{15}$ per $cm^3$ in the case of Se, and $10^{14}$ to $10^{16}$ per $cm^3$ in the case of Ar.

8. The device of claim 1, wherein the highly conductive structure comprises a Si—Ge-graded epitaxial hetero structure.

9. The device of claim 1, wherein drift zones of the n-type and p-type FETs are laterally isolated from each other.

10. The device of claim 1, comprising at least one isolation trench protruding vertically through at least one of the drift zones of the FETs, wherein the at least one isolation trench is lined or filled, wherein the lining or filling material comprises an isolating material, such that areas of the device laterally abutting the trench are isolated from each other by the trench.

11. The device of claim 10, wherein at least one container region of the device is electrically isolated from the potential of other parts of the device by a vertical isolation trench lined or filled with isolating material, the isolation trench protruding from a backside of the first substrate through the at least one drift zone.

12. The device of claim 11, wherein the at least one isolated container region comprises at least one driver and/or logic of the device.

13. A method of producing a power semiconductor device, the method comprising:
- providing a highly doped substrate with a first dopant type,
- providing at least one p-type drift zone and at least one n-type drift zone laterally adjacent to each other, wherein at least one drift zone has a complementary doping to the first dopant type of the first substrate,
- providing a highly conductive structure in a highly doped region located between the drift zone with the complementary doping and the highly doped substrate,
- providing at least one vertical FET employing the at least one p-type drift zone and at least one vertical FET employing the at least one n-type drift zone, the FETs employing the highly doped substrate as a common backside.

14. The method of claim 13, wherein providing the highly conductive structure comprises at least one of:
- etching at least one vertical trench protruding into the at least one drift zone with the complementary doping, and lining or filling the at least one vertical trench with a conductive material,
- implanting defect atoms into a highly doped region between the drift zone with the complementary doping and the highly doped substrate to form a highly doped contact area, wherein the defect atoms comprise at least one of Se, S, and Ar, and
- forming a Si—Ge-graded epitaxial hetero structure between the at least one drift zone with the complementary doping and the substrate.

15. The method of claim 14, wherein the conductive material comprises at least one of a carbon modification, graphite, ternary nitride, ternary silicide, Mo, W, eutectic material, and metal silicides.

16. The method of claim 14, wherein the defect atoms have a density of $10^{13}$ to $10^{15}$ per cm$^3$ in the case of Se, and $10^{14}$ to $10^{16}$ per cm$^3$ in the case of Ar.

17. A method of producing a semiconductor device, comprising:
- providing a first carrier wafer comprising a standard semiconductor material with a first doping,
- etching a first region for a first drift zone in a front surface of the carrier wafer,
- epitaxially growing a first drift zone in the first region, having a complementary doping to the doping of the carrier wafer, such that the carrier wafer has p-doped and n-doped regions on its front surface,
- implanting high doses of a p-dopant and n-dopant into a thin layer on the front surface of the p-doped and n-doped regions, respectively,
- providing a highly conductive structure in a highly doped region on a surface of the standard semiconductor material, protruding vertically in the highly doped front surface region of the standard semiconductor material,
- bonding a highly doped second carrier wafer, having a complementary doping to the first carrier wafer, to the front surface of the first carrier wafer,
- thinning the first carrier wafer, and
- providing at least one vertical FET employing the at least one p-type drift zone and the at least one vertical FET employing the at least one n-type drift zone,
wherein the FETs employ the p-doped and n-doped regions of the first carrier wafer as drift zones and employ the second carrier wafer as a common backside electrode.

18. The method of claim 17, wherein providing the highly conductive structure comprises at least one of:
- etching at least one vertical trench protruding into the at least one first drift zone, and lining or filling the at least one vertical trench with a conductive material,
- implanting defect atoms into a transition region between the first drift zone and the highly doped substrate to form a highly doped contact area, wherein the defect atoms comprise at least one of Se, S, and Ar,
- forming a Si—Ge-graded epitaxial hetero structure between the at least one first drift zone and the substrate.

19. The method of claim 18, wherein the conductive material comprises at least one of: a carbon modification, graphite, ternary nitride, ternary silicide, Mo, W, eutectic material, and metal silicides.

20. The method of claim 18, wherein the defect atoms have a density of $10^{13}$ to $10^{15}$ per cm$^3$ in the case of Se, and $10^{14}$ to $10^{16}$ per cm$^3$ in the case of Ar.

21. A method of producing a power semiconductor device, comprising:
- providing a carrier wafer which is highly doped with a first dopant type, having a front surface and a back surface,
- selectively growing a first SiO$_2$ layer on a part of a front surface of the carrier wafer,
- epitaxially growing a first device layer having a standard doping of the same dopant type as the carrier wafer on the front surface of the carrier wafer not covered with SiO$_2$,
- providing a second SiO$_2$ layer over the first device layer, covering a front surface and the side walls of the first device layer,
- selectively back etching the first SiO$_2$ layer until the carrier wafer is exposed,
- providing a highly doped second region of an opposite dopant type to that of the carrier wafer on the exposed area,
- providing a highly conductive structure in the region of the highly doped second region, protruding vertically from the highly doped second region into the highly doped carrier wafer,
- epitaxially growing a second device layer with a standard doping of the complementary type as the doping of the first device layer on the highly doped second region, until the second device layer has the same level as the laterally adjacent first device layer,
- back etching the second SiO$_2$ layer until the first device layer is exposed, and
- providing at least one vertical FET, employing the first device layer as a first drift zone, and at least one complementary vertical FET employing the second device layer as a second drift zone, on the first and second device layers, respectively,
wherein the FETs employ the highly doped carrier wafer as a common backside.

22. The method of claim 21, wherein providing the highly conductive structure comprises:
- etching at least one vertical trench from the back surface of the carrier wafer, protruding vertically through the highly doped second region up to the second device layer, and filling the at least one vertical trench with a conductive material,
- implanting defect atoms into a transition region between the carrier wafer and the highly doped second region, wherein the defect atoms comprise at least one of Se, S, and Ar, and
- forming a Si—Ge-graded epitaxial hetero structure between the carrier wafer and the highly doped second region.

23. The method of claim 22, wherein the conductive material comprises at least one of: a carbon modification, graphite, ternary nitride, ternary silicide, Mo, W, eutectic material, and metal silicides.

24. The method of claim 22, further comprising:
providing at least one trench filled with isolation material, isolating the first device layer laterally to a container region having an opposite dopant type to that of the first device layer and that of the carrier wafer, so that the container region is isolated from the other regions of the power semiconductor device by the trench and by a pn-transition region to the carrier wafer, and
providing at least one driver circuit and/or transistor logic for the power semiconductor device in the container region.

25. The method of claim 24, wherein the at least one trench further extends vertically through the carrier wafer up to the backside of the carrier wafer, so that the container region is completely isolated from other regions of the power semiconductor device by the isolation material of the trench.

* * * * *